(12) United States Patent
Furuhashi

(10) Patent No.: US 10,879,293 B2
(45) Date of Patent: Dec. 29, 2020

(54) SOLID-STATE IMAGING DEVICE, METHOD OF MANUFACTURING SOLID-STATE IMAGING DEVICE, AND ELECTRONIC DEVICE

(71) Applicant: SONY SEMICONDUCTOR SOLUTIONS CORPORATION, Kanagawa (JP)

(72) Inventor: Takahisa Furuhashi, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/462,445

(22) PCT Filed: Sep. 25, 2017

(86) PCT No.: PCT/JP2017/034408
§ 371 (c)(1),
(2) Date: May 20, 2019

(87) PCT Pub. No.: WO2018/116559
PCT Pub. Date: Jun. 28, 2018

(65) Prior Publication Data
US 2019/0386052 A1   Dec. 19, 2019

(30) Foreign Application Priority Data
Dec. 20, 2016 (JP) ................. 2016-246946

(51) Int. Cl.
H01L 27/146 (2006.01)
H01L 23/00 (2006.01)

(52) U.S. Cl.
CPC ........ *H01L 27/14634* (2013.01); *H01L 24/08* (2013.01); *H01L 24/80* (2013.01);
(Continued)

(58) Field of Classification Search
None
See application file for complete search history.

(56) References Cited

U.S. PATENT DOCUMENTS 8,710,607 B2    4/2014   Chen et al.
9,093,575 B2 *  7/2015   Yokoyama ........ H01L 27/14643
(Continued)

FOREIGN PATENT DOCUMENTS

CN    103545324 A    1/2014
CN    103715175 A    4/2014
(Continued)

OTHER PUBLICATIONS

International Search Report and Written Opinion of PCT Application No. PCT/JP2017/034408, dated Dec. 12, 2017, 10 pages of ISRWO.

*Primary Examiner* — Dung A. Le
(74) *Attorney, Agent, or Firm* — Chip Law Group

(57) ABSTRACT

There is provided a solid-state imaging device capable of reducing the number of wiring layers and achieving downsizing with flexible layout designing. The solid-state imaging device includes a first semiconductor chip including a first electrode pad, first wiring connected to a first electrode pad through a first via, and a logic circuit, which are formed therein, and a second semiconductor chip connected to the first semiconductor chip and including a second electrode pad, second wiring connected to the second electrode pad through a second via, and a pixel array, which are formed therein. The first electrode pad and the second electrode pad are bonded as being shifted from each other on a bonding surface of the first semiconductor chip and the second semiconductor chip. A total length of the shifted and bonded first and second electrode pads in an extending-direction of the wiring having a longer pitch of the first and second
(Continued)

wiring is twice or more of an extending-direction length of the wiring having the longer pith.

5 Claims, 16 Drawing Sheets

(52) U.S. Cl.
CPC .... *H01L 27/1469* (2013.01); *H01L 27/14636* (2013.01); *H01L 2224/08145* (2013.01); *H01L 2224/80895* (2013.01)

(56) References Cited

U.S. PATENT DOCUMENTS

| | | | |
|---|---|---|---|
| 2008/0150157 A1* | 6/2008 | Nishimura | H01L 25/0652 257/777 |
| 2012/0133056 A1* | 5/2012 | Takayanagi | H01L 25/03 257/777 |
| 2013/0092822 A1 | 4/2013 | Ichikawa et al. | |
| 2014/0091321 A1 | 4/2014 | Yokoyama | |
| 2015/0179691 A1 | 6/2015 | Yanagita et al. | |

FOREIGN PATENT DOCUMENTS

| | | |
|---|---|---|
| CN | 104428897 A | 3/2015 |
| JP | 2012-015276 A | 1/2012 |
| JP | 2014-022561 A | 2/2014 |
| JP | 2014-072418 A | 4/2014 |
| KR | 10-2014-0008983 A | 1/2014 |
| KR | 10-2015-0037812 A | 4/2015 |
| TW | 201405789 A | 2/2014 |
| WO | 2012/001922 A1 | 1/2012 |

\* cited by examiner

L1+L2≧2L $L1+L2 \geq 2L$

SOLID-STATE IMAGING DEVICE, METHOD OF MANUFACTURING SOLID-STATE IMAGING DEVICE, AND ELECTRONIC DEVICE

CROSS REFERENCE TO RELATED APPLICATIONS

This application is a U.S. National Phase of International Patent Application No. PCT/JP2017/034408 filed on Sep. 25, 2017, which claims priority benefit of Japanese Patent Application No. JP 2016-246946 filed in the Japan Patent Office on Dec. 20, 2016. Each of the above-referenced applications is hereby incorporated herein by reference in its entirety.

TECHNICAL FIELD

The present technology relates to a solid-state imaging device, a method of manufacturing the solid-state imaging device, and an electronic device and, more particularly, relates to a technique of a solid-state imaging device configured by bonding a plurality of semiconductor chips.

BACKGROUND ART

Conventionally, in a case where a three-dimensional integrated circuit, a solid-state imaging device, and the like are manufactured by bonding semiconductor devices including semiconductor members to each other, a method of directly bonding Cu electrodes provided on bonding surfaces of the semiconductor devices have been used. The Cu electrodes to be bonded by such a method are used for wiring; however, connection electrodes need to be routed to connect the Cu electrodes on a plane surface, and an area used to wire the connection electrodes is increased depending on a type of the configuration circuit, and this may hinder downsizing of the semiconductor device.

On the other hand, for example, Patent Document 1 proposes a semiconductor device including a semiconductor layer having an active region, a semiconductor element formed using the active region, a connection region formed by metalizing a part of the semiconductor layer as an island-like manner being isolated from the active region, an insulating film provided covering one main surface side of the semiconductor layer, an electrode disposed facing the semiconductor element and the connection region via the insulating film, and a contact provided selectively through the insulating film at a needed part out of parts connecting the semiconductor element or the connection region with the electrode. According to the technology of Patent Document 1, a desired circuit can be formed by selecting contact arrangements in addition to routing of the wiring, thus, it has been assumed that this can reduce the size of the semiconductor device.

CITATION LIST

Patent Document

Patent Document 1: Japanese Patent Application Laid-Open No. 2014-072418

SUMMARY OF THE INVENTION

Problems to be Solved by the Invention

However, with the technology proposed in Patent Document 1, since flexibility of designing is restricted, it may be considered that layout cannot be designed flexibly and a cost cannot be reduced by downsizing the semiconductor device and the solid-state imaging device.

In view of the above circumstances, the present technology has been made and has an object to provide a solid-state imaging device capable of reducing the number of wiring layers by a flexible layout design and reducing a cost by further downsizing the device.

Solutions to Problems

In order to solve the above problem, a solid-state imaging device which is an example of the present technology includes a first semiconductor chip including a first electrode pad, first wiring connected to the first electrode pad through a first via, and a logic circuit, which are formed therein, and a second semiconductor chip connected to the first semiconductor chip and including a second electrode pad, second wiring connected to the second electrode pad through a second via, and a pixel array, which are formed therein, in which the first electrode pad and the second electrode pad are bonded as being shifted from each other on a bonding surface of the first semiconductor chip and the second semiconductor chip, and a total length of the shifted and bonded first and second electrode pads in an extending-direction of the wiring having a longer pitch of the first and second wiring is twice or more of an extending-direction length of the wiring having the longer pitch.

Further, in the method of manufacturing a solid-state imaging device which is an example of the present technology, the method includes forming a first electrode pad, first wiring connected to the first electrode pad through a first via, and a logic circuit in a first semiconductor chip, forming a second electrode pad, second wiring connected to the second electrode pad through a second via, and a pixel array in a second semiconductor chip, which is bonded to the first semiconductor chip, and bonding the first semiconductor chip and the second semiconductor chip on a bonding surface, in which the first electrode pad and the second electrode pad are bonded as being shifted from each other on the bonding surface, and a total length of the shifted and bonded first and second electrode pads in an extending-direction of the wiring having a longer pitch of the first and second wiring is twice or more of an extending-direction length of the wiring having the longer pitch.

Further, an electronic device which is an example of the present technology includes a solid-state imaging device including a first semiconductor chip including a first electrode pad, first wiring connected to the first electrode pad through a first via, and a logic circuit, which are formed therein, and a second semiconductor chip bonded to the first semiconductor chip and including a second electrode pad, a second wiring connected to the second electrode pad through a second via, and a pixel array, which are formed therein, in which the first electrode pad and the second electrode pad are bonded as being shifted from each other on a bonding surface of the first semiconductor chip and the second semiconductor chip, and a total length of the shifted and bonded first and second electrode pads in an extending-direction of the wiring having a longer pitch of the first and second wiring is twice or more of an extending-direction length of the wiring having the longer pitch.

Effects of the Invention

According to the present technology, with flexible layout designing, the number of wiring layers can be reduced and the solid-state imaging device can be downsized. Note that effects of the present technology should not be limited to the above described effects and there may be any one of the effects described in the present disclosure.

MODE FOR CARRYING OUT THE INVENTION

Figure 1:
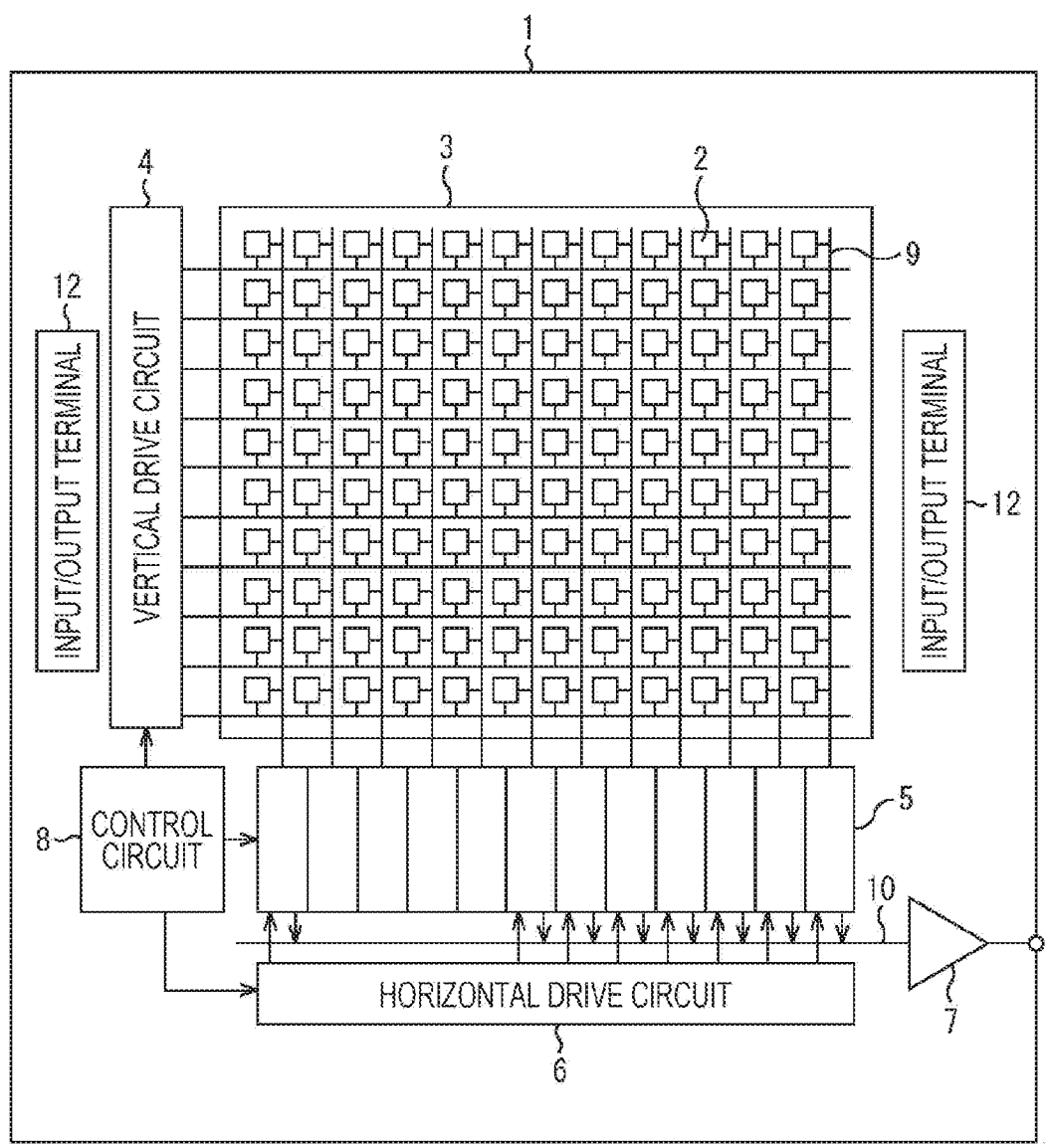
FIG. 1 is a block diagram illustrating a configuration example of a solid-state imaging device according to the present technology.

Hereinafter, preferred embodiments for implementing the present technology will be described with reference to the drawings. It is noted that following embodiments describe examples of representative embodiments of the present technology, and those examples should not limit understanding of the scope of the present technology.

Note that the description will be given in the following order.

1. Configuration example of solid-state imaging device
2. Laminated structure example of solid-state imaging device
3. Solid-state imaging device according to first embodiment
4. Solid-state imaging device according to second embodiment
5. Solid-state imaging device according to third embodiment
6. Solid-state imaging device according to fourth embodiment
7. Solid-state imaging device according to fifth embodiment
8. Electronic device according to sixth embodiment <1. Configuration Example of Solid-State Imaging Device>

FIG. 1 is a block diagram illustrating a configuration example of a solid-state imaging device according to the present technology.

As illustrated in FIG. 1, a solid-state imaging device 1 is configured as, for example, a complementary metal oxide semiconductor (CMOS) image sensor. The solid-state imaging device 1 includes a pixel region (pixel array) 3 in which a plurality of pixels 2 are regularly arranged in a two-dimensional array on an unillustrated semiconductor substrate (for example, Si substrate) and a peripheral circuit section.

The pixels 2 include a photoelectric conversion unit (for example, a photodiode) and a plurality of pixel transistors (MOS transistors). The plurality of pixel transistors can include three transistors, for example, a transfer transistor, a reset transistor, and an amplification transistor. In addition, the plurality of pixel transistors can include four transistors by adding a selection transistor. Here, since an equivalent circuit of a unit pixel is similar to a well-known technology, detailed explanation will be omitted.

In addition, the pixels 2 may be configured as one unit pixel or may be a shared pixel structure. In this pixel sharing structure, a plurality of photodiodes share a floating diffusion and the transistors other than a plurality of transfer transistors. In other words, in a shared pixel, the photodiodes and the transfer transistors composing the plurality of unit pixels share the other respective pixel transistors.

The peripheral circuit section includes a vertical drive circuit 4, a column signal processing circuit 5, a horizontal drive circuit 6, an output circuit 7, and a control circuit 8.

The vertical drive circuit 4 is composed by, for example, a shift register. The vertical drive circuit 4 selects the pixel drive wiring, supplies pulses for driving the pixels to the selected pixel drive wiring, and drives the pixels in row units. In other words, the vertical drive circuit 4 sequentially selects and scans each pixel 2 of the pixel array 3 in the vertical direction in units of rows. Then, the vertical drive circuit 4 supplies the column signal processing circuit 5 with a pixel signal based on a signal charge generated according to an amount of received light in the photoelectric conversion unit of each pixel 2 through a vertical signal line 9.

The column signal processing circuit 5 is arranged, for example, for each column of the pixels 2. The column signal processing circuit 5 performs signal processing such as noise removal for each pixel column according to the signal output from the pixel 2 for one row. More specifically, the column signal processing circuit 5 performs signal processing such as correlated double sampling (CDS), signal amplification, and analog/digital (A/D) conversion for removing a fixed pattern noise peculiar to the pixel 2. A horizontal selection switch (not shown) is provided in an output stage of the column signal processing circuit 5 so as to be connected to a horizontal signal line 10.

The horizontal drive circuit 6 includes, for example, a shift register. The horizontal drive circuit 6 sequentially selects each of the column signal processing circuits 5 by sequentially outputting horizontal scanning pulses, and outputs pixel signals from each of the column signal processing circuits 5 to the horizontal signal line 10.

The output circuit 7 performs signal processing on the signals sequentially supplied from the column signal processing circuits 5 through the horizontal signal line 10, and outputs the processed signals. For example, the output circuit 7 may perform only buffering or may perform black level adjustment, column variation correction, various digital signal processing, and the like.

The control circuit 8 receives an input clock, data instructing an operation mode and the like, and outputs data such as internal information of the solid-state imaging device 1. In addition, the control circuit 8 outputs clock signals and control signals, which serve as references for operations of the vertical drive circuit 4, the column signal processing circuit 5, the horizontal drive circuit 6, and the like on the basis of the vertical synchronization signal, the horizontal synchronization signal, and the master clock. Then, the control circuit 8 inputs these signals to the vertical drive circuit 4, the column signal processing circuit 5, the horizontal drive circuit 6, and the like.

Input/output terminals 12 transmit and receive signals to and from outside.

<2. Laminated Structure Example of Solid-State Imaging Device>

Figure 2A:
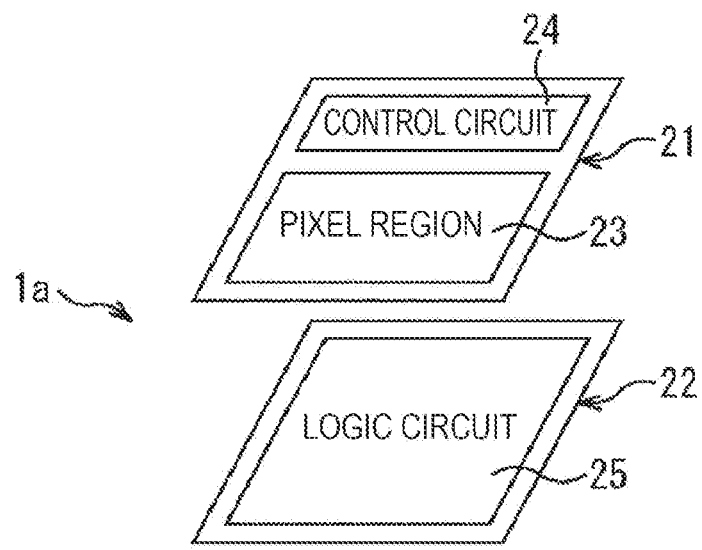
FIG. 2A is a schematic diagram illustrating a laminated structure of the solid-state imaging device according to the present technology.
Figure 2B:
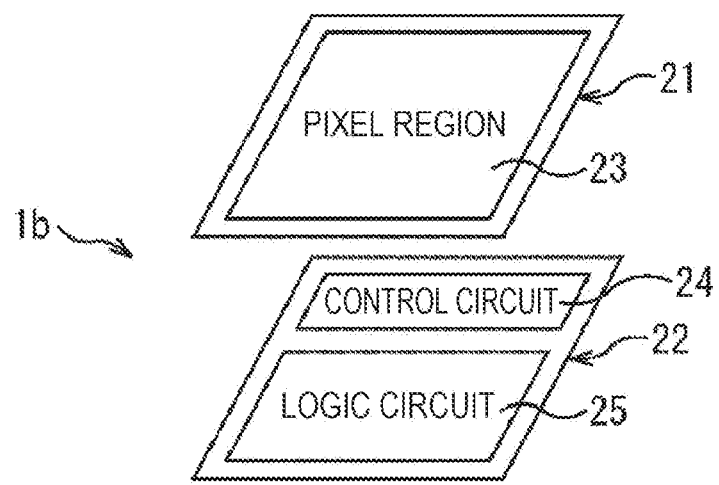
FIG. 2B is a schematic diagram illustrating the laminated structure of the solid-state imaging device according to the present technology.
Figure 2C:
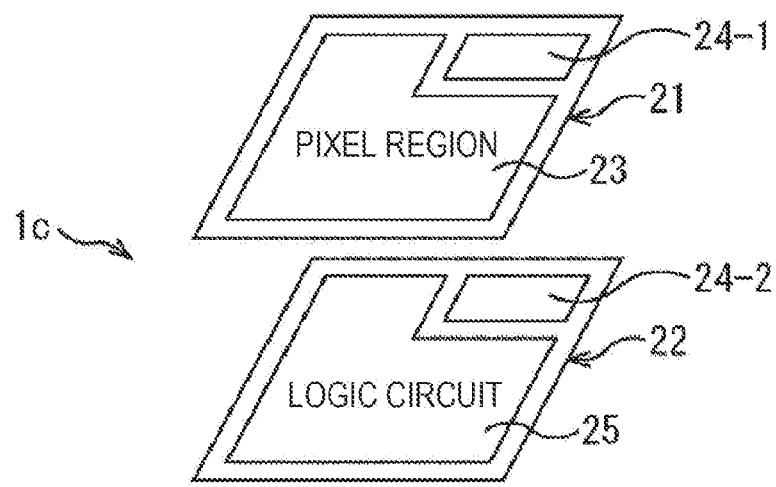
FIG. 2C is a schematic diagram illustrating the laminated structure of the solid-state imaging device according to the present technology.

FIGS. 2A, 2B, and 2C are schematic diagrams illustrating examples of a laminated structure of the solid-state imaging device according to the present technology. Referring to FIGS. 2A, 2B, and 2C, the example of a laminated structure of the solid-state imaging device using the present technology will be described.

As a first example, a solid-state imaging device 1a illustrated in FIG. 2A includes a first semiconductor substrate 21 and a second semiconductor substrate 22. On the first semiconductor substrate 21, a pixel array 23 and a control circuit 24 are mounted. On the second semiconductor substrate 22, a logic circuit 25 including a signal processing circuit is mounted. Then, the first semiconductor substrate 21 and the second semiconductor substrate 22 are electrically connected to each other, and this forms the solid-state imaging device 1a having a single semiconductor chip.

As a second example, a solid-state imaging device 1b illustrated in FIG. 2B includes a first semiconductor substrate 21 and a second semiconductor substrate 22. On the first semiconductor substrate 21, a pixel array 23 is mounted. On the second semiconductor substrate 22, a control circuit 24 and a logic circuit 25 including a signal processing circuit are mounted. Then, the first semiconductor substrate 21 and the second semiconductor substrate 22 are electrically connected to each other, and this forms the solid-state imaging device 1b having a single semiconductor chip.

As a third example, a solid-state imaging device 1c illustrated in FIG. 2C includes a first semiconductor substrate 21 and a second semiconductor substrate 22. On the first semiconductor substrate 21, a pixel array 23 and a control circuit 24-1 for controlling the pixel array 23 are mounted. On the second semiconductor substrate 22, a control circuit 24-2 for controlling a logic circuit 25 and the logic circuit 25 including a signal processing circuit are mounted. Then, the first semiconductor substrate 21 and the second semiconductor substrate 22 are electrically connected to each other, and this forms the solid-state imaging device 1c having a single semiconductor chip.

Depending on the configuration of the CMOS image sensor, two or more semiconductor chip portions may be bonded together although not shown. For example, a CMOS image sensor may be formed by adding a semiconductor chip portion including a memory element array, a semiconductor chip portion including other circuit elements, and the like in addition to the above described first and second semiconductor chip portions and pasting three or more semiconductor chip portions as a single chip.

<3. Solid-State Imaging Device According to the First Embodiment>

[Configuration Example of Solid-State Imaging Device]

Figure 3:
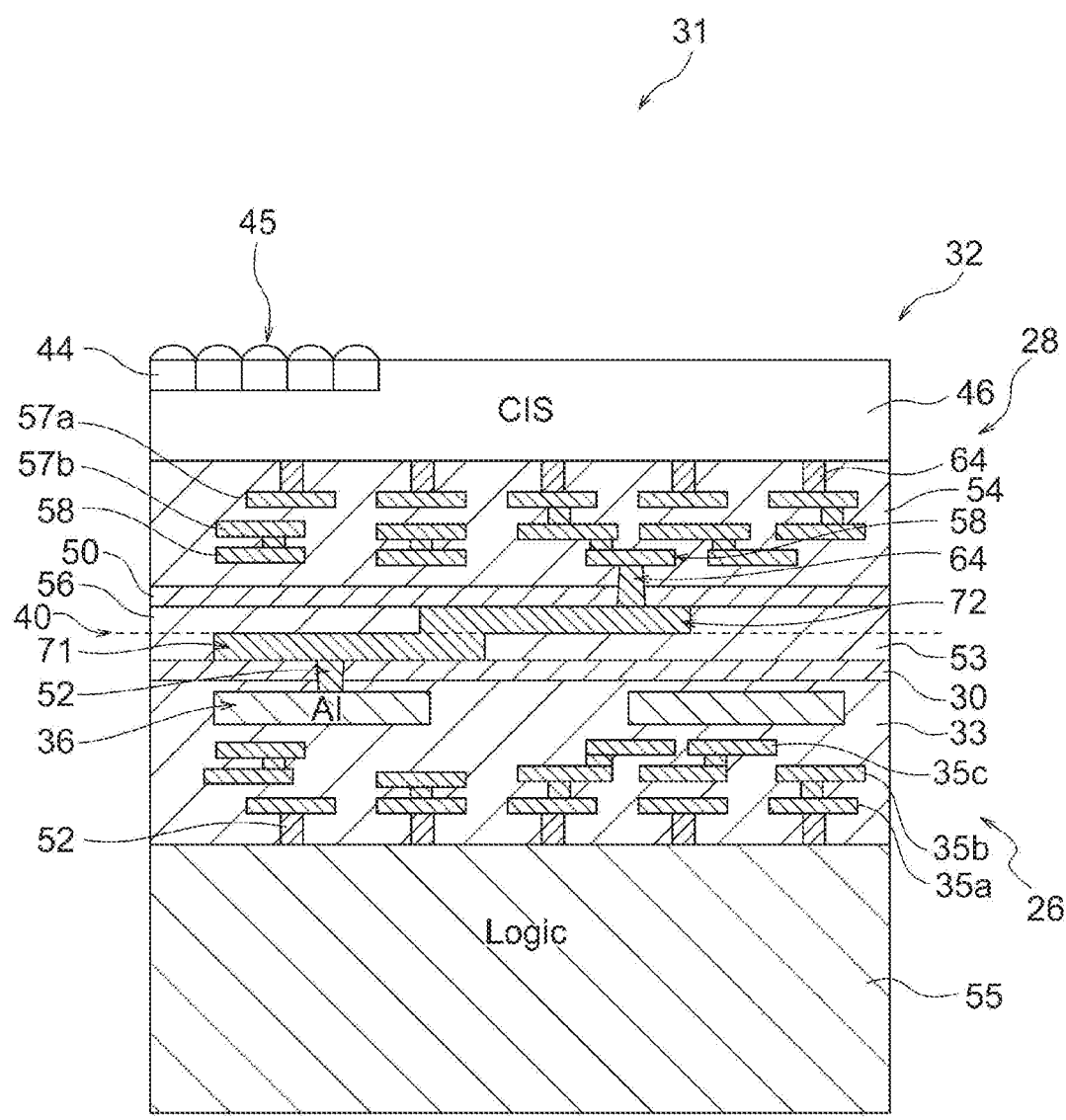
FIG. 3 is a schematic cross-sectional diagram illustrating a main part of a first embodiment of the solid-state imaging device according to the present technology.

FIG. 3 illustrates a first embodiment of the solid-state imaging device (image sensor) according to the present technology, which is a backside illumination type CMOS image sensor. The backside illumination type CMOS image sensor has a light receiving unit arranged in an upper part of a circuit unit and is a CMOS image sensor with high sensitivity and low noise compared with a front illuminated type. A solid-state imaging device 31 according to the first embodiment includes a laminated semiconductor chip 32 in which a first semiconductor chip portion 26 formed with a logic circuit 55 and a second semiconductor chip portion 28 formed with the pixel array 23 and the control circuit 24 similar to the solid-state imaging device 1a in FIG. 2A are bonded to one another. The first semiconductor chip portion 26 and the second semiconductor chip portion 28 are bonded to each other such that later described mutual multilayer wiring layers face each other and the electrode pads are directly joined to each other.

In the first semiconductor chip portion 26, the logic circuit 55 constituting a peripheral circuit is formed in a region which will be a semiconductor chip portion of the first semiconductor substrate including silicon. The logic circuit 55 includes a plurality of MOS transistors including a CMOS transistor. On the surface side (the upper side in FIG. 3) of the first semiconductor substrate on which the logic circuit 55 is formed as illustrated in FIG. 3, a multilayer wiring layer in which a plurality of layers, which are wiring 35a to 35c of three layers of metal in this embodiment, and a wiring (lower layer wiring) 36 of one layer of aluminum (Al) are arranged via an interlayer insulating film 33. For the wiring 35a to 35c, a copper (Cu) wiring by a dual damascene method is used.

In the first semiconductor chip portion 26, each MOS transistor is formed with a pair of source/drain regions and a gate electrode via the gate insulating film in a semiconductor well region on the front surface side of the first semiconductor substrate. Each MOS transistor is separated by, for example, an element isolation region having an STI structure.

In the multilayer wiring layer of the first semiconductor chip portion 26, the MOS transistor and the wiring 35a, and the wiring 35a to 35c of adjacent upper and lower layers are connected through a first via 52 having conductivity. Furthermore, a first electrode pad (first conductor) 71 of metal is formed so as to face a bonding surface 40 to be bonded with the second semiconductor chip portion 28. The first electrode pad 71 is connected, through the first via 52, to a necessary wiring (lower layer wiring) 36 including aluminum (Al) of the fourth layer. The first electrode pad 71 is used for wiring.

In the second semiconductor chip portion 28, a pixel array in which a plurality of pixels each including a photodiode PD serving as a photoelectric conversion unit and a plurality of pixel transistors are arranged in a two-dimensional array on a second semiconductor substrate including thinned silicon Is formed. In addition, although it is not illustrated, a plurality of MOS transistors constituting the control circuit 24 are formed on the second semiconductor substrate. On the front surface side (the lower side in FIG. 3) of the second semiconductor substrate, a multilayer wiring layer in which a plurality of three layers of metal wiring 57a, 57b and 58, in the present embodiment, are disposed via the interlayer insulating film 54. As the wiring 57a, 57b and 58, a copper (Cu) wiring formed by a dual damascene method is used. On the back side (the upper side in FIG. 3) of the second semiconductor substrate, a color filter 44 and an on-semiconductor chip lens 45 are formed on an effective pixel array via an insulating film and a planarization film in a region of CMOS image sensor (CIS) 46. Furthermore, although it is not illustrated, the on-semiconductor chip lens 45 can be formed on an optical black region formed via the insulating film of the CIS 46 on the back side of the second semiconductor substrate.

In the multilayer wiring layer of the second semiconductor chip portion 28, a corresponding pixel transistor and the wiring 57a, and adjacent upper and lower layer wiring 57a, 57b and 58 are connected through the conductive second via 64. Furthermore, a second electrode pad (second conductor) 72 of metal is formed so as to face the bonding surface 40 to be bonded with the first semiconductor chip portion 26. The second electrode pad 72 is connected to the necessary wiring (upper layer wiring) 58 of the third layer metal through the second via 64. The second electrode pad 72 is used for wiring.

The first semiconductor chip portion 26 and the second semiconductor chip portion 28 are directly bonded to the first electrode pad 71 and the second electrode pad 72 facing the bonding surface 40 so that the multilayer wiring layers face each other, and are electrically connected. The interlayer insulating film 53 is formed near a bonding area of the first semiconductor chip portion 26. The interlayer insulating film 56 is formed near the bonding area of the second semiconductor chip portion 28. The interlayer insulating films 53 and 56 are bonded to the interlayer insulating films 33 and 54 via the insulating layers 30 and 50, respectively.

As later described regarding a manufacturing method, the interlayer insulating films 53 and 56 are formed in a combination of a Cu diffusion barrier insulating film for preventing Cu diffusion of the first electrode pad 71 and the second electrode pad 72 and an insulating film having no Cu diffusion barrier property. The first electrode pad 71 and the second electrode pad 72 are directly bonded by thermal diffusion bonding. The interlayer insulating films 53 and 56 other than the first electrode pad 71 and the second electrode pad 72 are bonded by plasma bonding or an adhesive.

As described above, in addition to the method of directly bonding the first electrode pad 71 and the second electrode pad 72 as facing the bonding surface 40, an insulating thin film (not illustrated), which is very thin and uniform, may be formed on the surface of each of the multilayer wiring layers and bonded by plasma bonding or the like.

Figure 4:
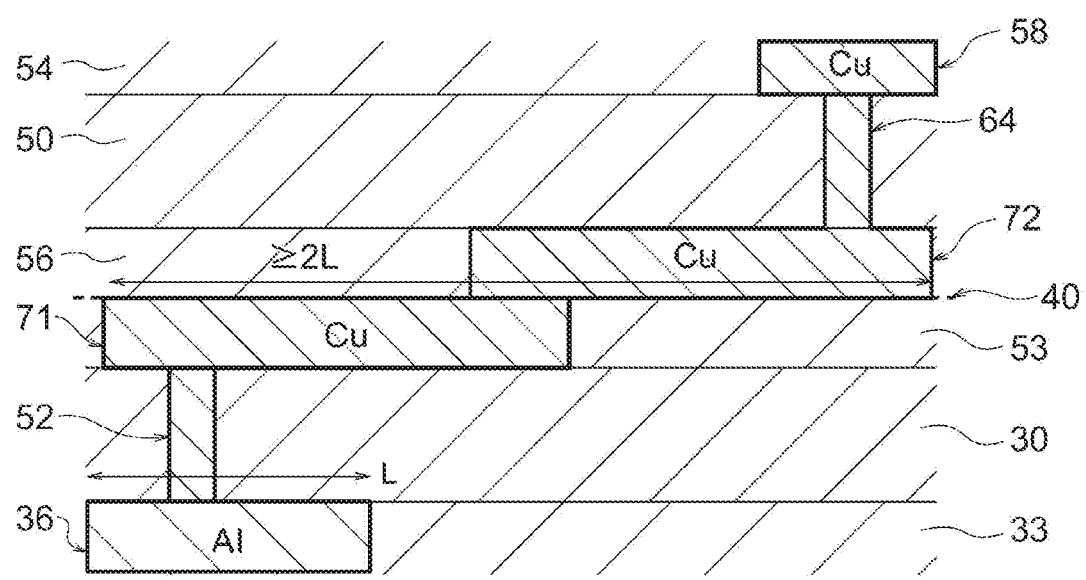
FIG. 4 is an enlarged cross-sectional diagram illustrating a main part of a bonded area according to the first embodiment.

Note that, according to the conventional technology, in a case where the Cu electrode is used for wiring, the electrode pads or the connecting wires are bonded so that the bonding surfaces thereof are corresponding to each other. In contrast, according to the present embodiment, as illustrated in FIGS. 3 and 4 (enlarged diagrams of the main parts), the first electrode pad 71 and the second electrode pad 72 are bonded so that the bonding surfaces thereof are shifted from each other. As a result, with the solid-state imaging device 31 according to the present embodiment, more flexible layout designing can be achieved.

[Configuration Example of Main Part of Solid-State Imaging Device]

Figure 5:
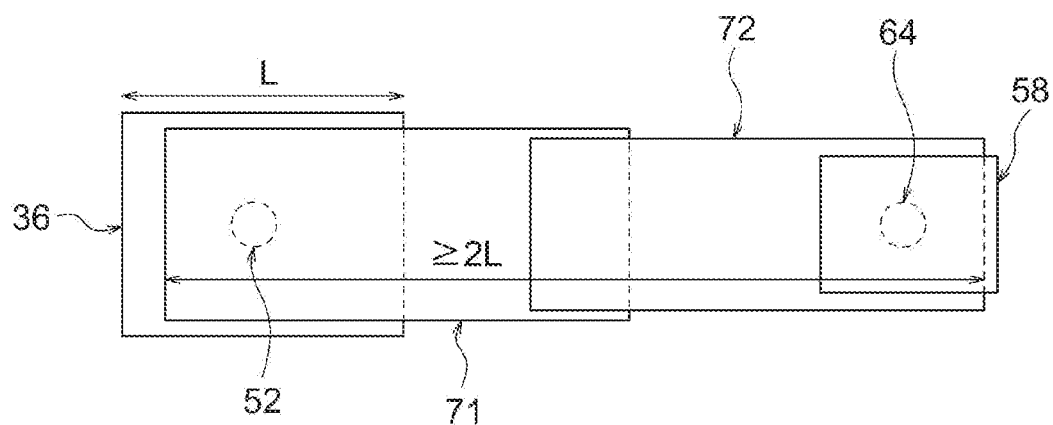
FIG. 5 is an enlarged plan diagram illustrating a main part of the bonded area according to the first embodiment.
Figure 6:
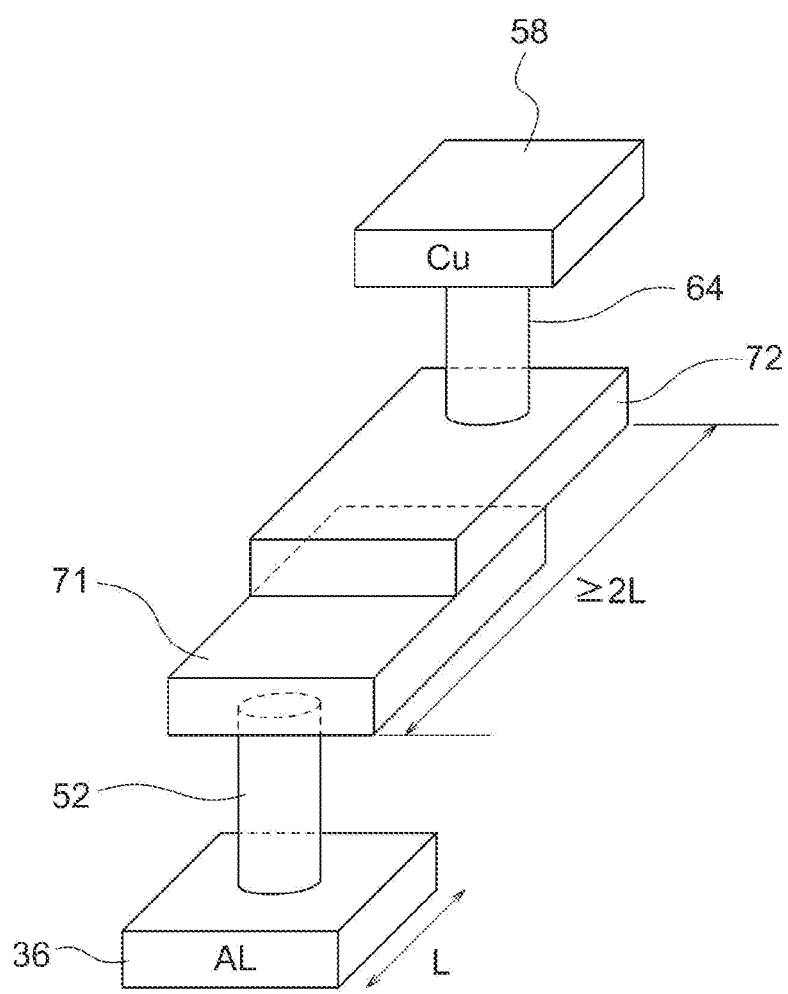
FIG. 6 is an enlarged configuration diagram illustrating the main part of the bonded area according to the first embodiment.

With reference to FIGS. 4 to 7, a main part of the solid-state imaging device of the present embodiment will be described. FIG. 4 is an enlarged cross-sectional diagram illustrating a bonded area of the first semiconductor chip portion 26 and the second semiconductor chip portion 28 according to the present embodiment. FIG. 5 is an enlarged plan diagram illustrating the bonded area of the first semiconductor chip portion 26 and the second semiconductor chip portion 28 according to the present embodiment. FIG. 6 is an enlarged configuration diagram illustrating the bonded area of the first semiconductor chip portion 26 and the second semiconductor chip portion 28 according to the present embodiment.

As illustrated in FIG. 4, the first electrode pad 71 according to the present embodiment is connected to a lower A1 wiring 36, which is the first wiring, through the first via 52. In addition, the second electrode pad 72 according to the present embodiment is connected to an upper layer Cu wiring 58, which is the second wiring, through the second via 64. Then, the first electrode pad 71 and the second electrode pad 72 are bonded to each other at the bonding surface 40 as being shifted from each other. Furthermore, as illustrated in FIGS. 5 and 6, the planar shapes of the first electrode pad 71 and the second electrode pad 72 are both rectangular, and a part thereof is overlapped and bonded in a manner that longitudinal directions of those correspond to each other.

Here, a longitudinal length of the second electrode pad 72 is assumed to be L1, and a longitudinal length of a part of the first electrode pad 71 where first electrode pad 71 is not overlapping with the second electrode pad 72 is assumed to be L2. In other words, a total length from an end to the other end in the longitudinal direction of the first shifted and bonded electrode pad 71 and the second electrode pad 72 is L1+L2. Furthermore, according to the present embodiment, a length of the first wiring 36 in an extending direction is assumed to be L since the wiring having the longer pitch of the first wiring 36 and the second wiring 58 is the first wiring 36. Then, according to the present embodiment, the longitudinal direction of the first electrode pads 71 and the second electrode pads 72 which are shifted and bonded together corresponds to an extending direction of the first wiring 36.

On the basis of the above conditions, according to the present embodiment, the first electrode pad 71, the second electrode pad 72, and the first wiring 36 are arranged so that the total longitudinal length (L1+L2) of the first electrode pad 71 and the second electrode pad 72 which are shifted and bonded becomes twice or more of the extending-direction length (L) of the first wiring 36 (L1+L2≥2L). Here, the expression "twice or more of the extending-direction length" of the first wiring 36 is synonymous with a minimum pitch of the first wiring 36, and the total length (L1+L2) needs to be twice or more of the extending-direction length (L) of the first wiring 36 since adjacent first wiring 36 cannot be connected by electrode pads if the length of the electrode pads is shorter than the minimum pitch. Here, in a case where the wiring having a longer pitch is the second wiring 58 of the first wiring 36 and the second wiring 58, an extending-direction length of the second wiring 58 is assumed to be L, and the first electrode pad 71, the second electrode pad 72, and the second wiring 58 are arranged.

Since the solid-state imaging device 31 according to the present embodiment is arranged as described above, flexible layout designing can be achieved and the number of wiring layers can be reduced. In addition, the length can be made shorter compared to a conventional structure in which wiring is formed with the same upper and lower Cu electrode pads. With this configuration, further downsizing of the device becomes possible, and the material cost can be reduced.

Furthermore, an area (So) of the bonding part between the first electrode pad 71 and the second electrode pad 72 can be in a size (So≥N×Sv), which is equal to or greater than a total area of bonding surfaces (N×Sv) of the first via 52 and the second via 64 respectively connected to the first electrode pad 71 and the second electrode pad 72. Here, N represents the number of vias (N=2 in the present embodiment) connected to one of the electrode pads, and Sv represents a connection area of the via.

As a result, a voltage drop of the electrode pad can be made smaller than a voltage drop of the via, and a resistance value in a circuit design can be determined by the via, so that an occurrence of the voltage drop due to a high resistance can be prevented. Furthermore, the resistance value of the electrode pad can be made flexible. As a result, a large current can flow with a low resistance value, and the electrode pad can be utilized more effectively for wiring.

Figure 7:
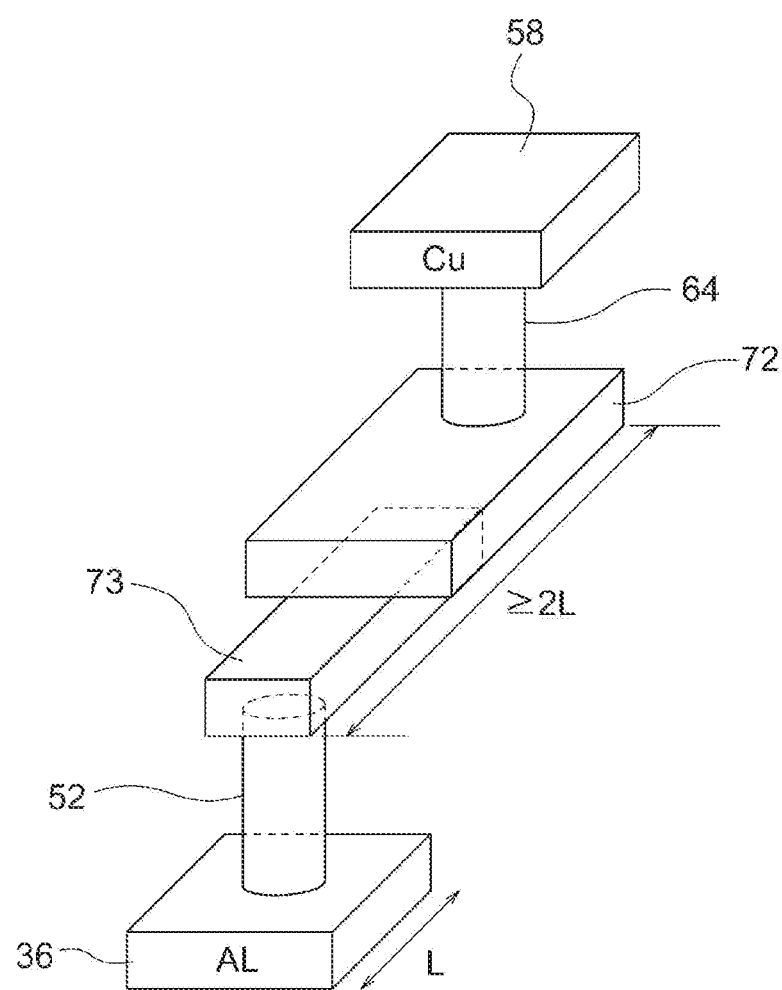
FIG. 7 is an enlarged configuration diagram illustrating the main part of the bonded area according to a modification of the first embodiment.
Figure 8:
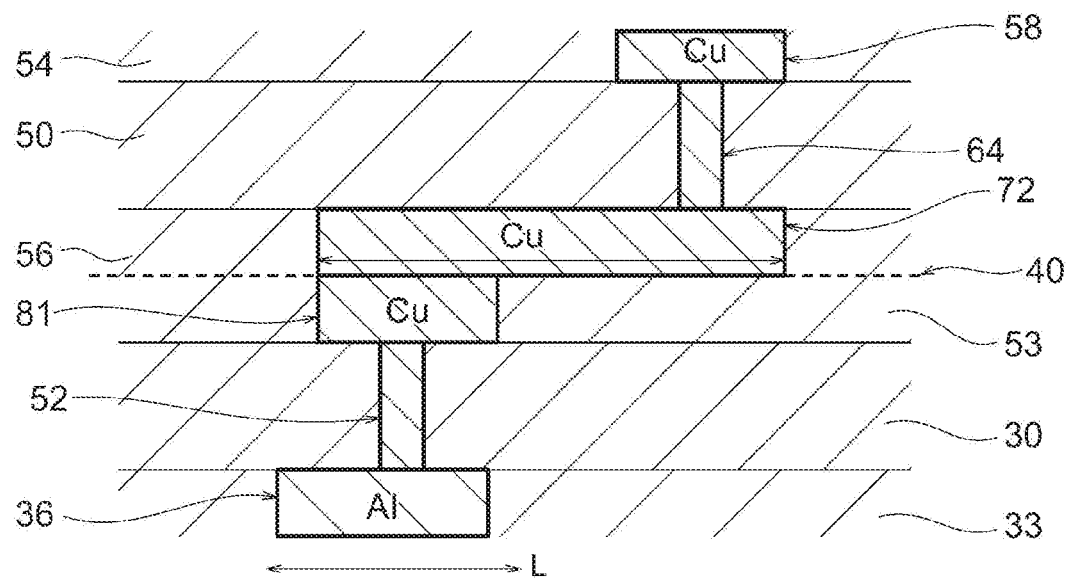
FIG. 8 is an enlarged cross-sectional diagram illustrating a main part of a bonded area according to a second embodiment.
Figure 9:
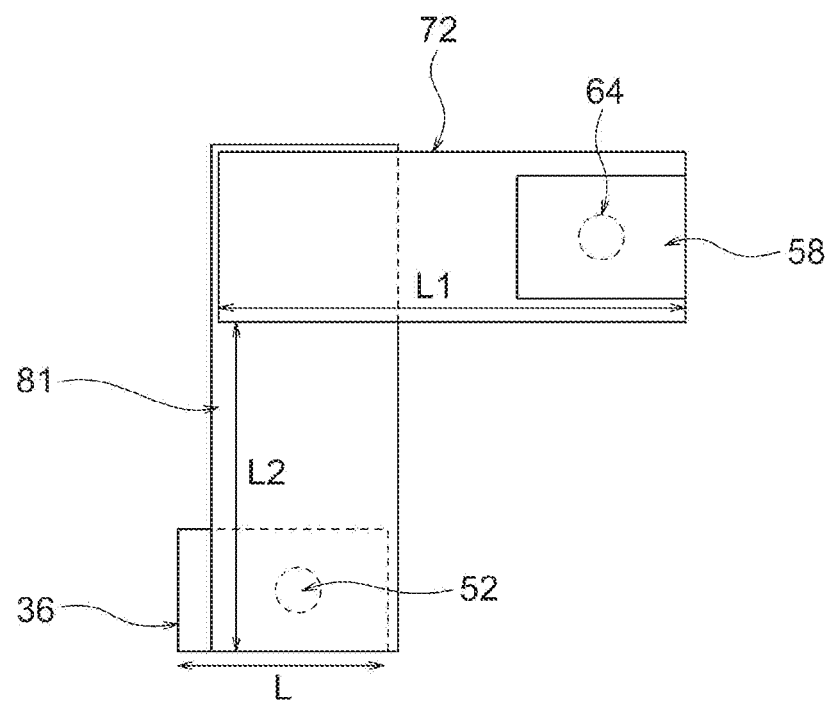
FIG. 9 is an enlarged plan diagram illustrating the main part of the bonded area according to the second embodiment.
Figure 10:
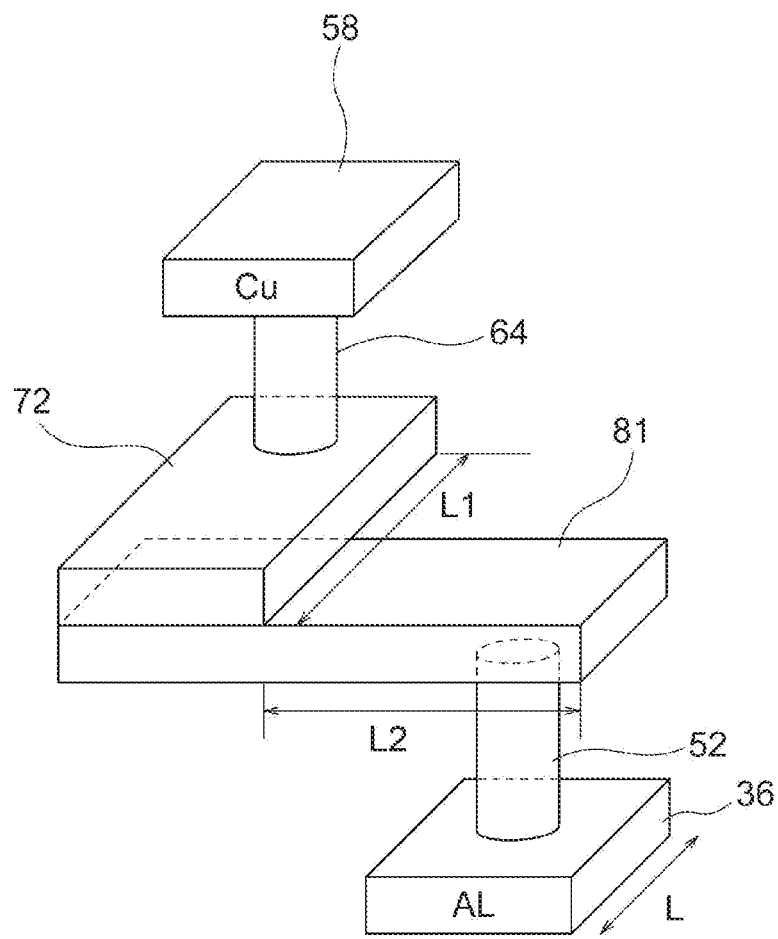
FIG. 10 is an enlarged configuration diagram illustrating the main part of the bonded area according to the second embodiment.

FIG. 7 is an enlarged configuration diagram illustrating a bonded area of the first semiconductor chip portion 26 and the second semiconductor chip portion 28 according to a modification of the present embodiment. The modification of FIG. 7 is different from the embodiment of FIG. 6 in that a width of the first electrode pad 73 is narrower than a width of the first electrode pad 71.

As illustrated in FIG. 7, even if the shapes of the first electrode pad 73 and the second electrode pad 72 are different, the similar effects as those of the above described embodiment can be achieved by arranging the first electrode pad 73, the second electrode pad 72 and the first wiring 36 so that the total longitudinal length (L1+L2) of the first electrode pad 73 and the second electrode pad 72 which are shifted and bonded becomes twice or more (L1+L2≥2L) of the extending-direction length (L) of the first wiring 36 having a longer pitch. Furthermore, according to the modification of FIG. 7, since the second electrode pad 72 is large, the conduction margin against the misalignment can be increased. Here, a planar shape of the electrode pad according to the present technology may be various shapes, and is not limited to the rectangular shape as described in the present embodiment.

[Example of Method of Manufacturing Solid-State Imaging Device]

Next, an example of a method of manufacturing the solid-state imaging device 31 according to the present embodiment will be described.

First, a semiconductor well region is formed in a region to be a semiconductor chip portion of a second semiconductor wafer including, for example, silicon (hereinafter referred to as a semiconductor substrate), and a photodiode PD serving as a photoelectric conversion unit of each pixel is formed in this semiconductor well region. As an example, an element isolation region can be initially formed and placed. Each photodiode PD is formed to extend in the depth direction of the semiconductor well region. The photodiode PD is formed in the effective pixel array and the optical black region, which constitute the pixel array.

Furthermore, a plurality of pixel transistors constituting each pixel are formed on the surface side of the semiconductor well region. For example, the pixel transistor can include a transfer transistor, a reset transistor, an amplification transistor, and a selection transistor. Here, as described above, pixel transistors are described as a representative. Each pixel transistor has a pair of source/drain regions and a gate electrode formed via a gate insulating film.

On the upper surface of the front surface side of the semiconductor substrate, a plurality of layers, which are wiring 57a, 57b, and 58 including a three-layer metal in this embodiment, including the second via 64 are formed via an interlayer insulating film 54. The wiring 57a, 57b, and 58 can be formed by a dual damascene method. In other words, a connection hole and a wiring trench by via-first are formed in the interlayer insulating film 54 at the same time, a Cu diffusion barrier metal film for preventing diffusion of Cu and a Cu seed film are formed, and then a Cu material layer is buried by a plating method. Examples of the Cu diffusion barrier metal film include Ta, TaN, Ti, TiN, W, WN, Ru, TiZrN, and an alloy film containing those. Next, the excess Cu material layer is removed by a chemical mechanical polishing (CMP) method, and Cu wiring integral with the planarized conductive via is formed. Thereafter, a Cu diffusion barrier insulating film is formed. As the Cu barrier insulating film, for example, an insulating film of SiN, SiC, SiCN, SiON or the like can be used. By repeating this process, the wiring 57a, 57b, 58 of three layers of metal are formed.

Next, a first insulating film having no Cu diffusion barrier property, a second insulating film having no Cu diffusion barrier property, and a Cu diffusion barrier insulating film are sequentially formed. The first insulating film and the second insulating film include a SiO2 film, a SiCOH film, or the like. Furthermore, as the Cu barrier insulating film, for example, an insulating film of SiN, SiC, SiCN, SiON, or the like can be used as described above. The Cu diffusion barrier insulating film, the first insulating film, and the second insulating film correspond to the interlayer insulating film 54. Next, the Cu diffusion barrier insulating film on an outermost surface, the second insulating film and the first insulating film are patterned by via-first using lithography and etching techniques to selectively make a via hole to be an opening. Thereafter, the second insulating film portion is patterned to selectively form the opening. In other words, the patterning is performed so as to have an opening in a portion corresponding to the second electrode pad 72 to be formed and the via hole.

Next, similarly to the above, the second electrode pad 72 having the opening and the second via 64 connected to the wiring 58 are formed by embedding the Cu material in the opening and the via hole by the dual damascene method. The second electrode pad 72 includes the metal of the fourth layer. As a result, the multilayer wiring layer is formed by the metal wiring 57a, 57b, and 58, the second electrode pad 72, the interlayer insulating film 54, and the insulating film.

Furthermore, an insulating thin film, which is extremely thin and uniform, can be formed on the second electrode pad 72.

On the other hand, a semiconductor well region is formed in a region to be a semiconductor chip portion of a first semiconductor wafer (hereinafter referred to as a semiconductor substrate) including, for example, silicon. A plurality of MOS transistors constituting the logic circuit 55 are formed in this semiconductor well region. Here, as described above, the MOS transistors are described as a representative. As an example, an element isolation region can be initially formed and placed.

On the upper surface of the front surface side of the semiconductor substrate, wiring 35a, 35b, and 35c including a plurality of layers, in this embodiment, three layers of metal, are formed including the first via 52 via an interlayer insulating film 33. The wiring 35a, 35b, 35c can be formed by a dual damascene method. In other words, a connection hole and a wiring trench by a via-first are formed at same time in an interlayer insulating film, a Cu diffusion barrier metal film for preventing diffusion of Cu and a Cu seed film are formed, and then a Cu material layer is buried by a plating method. Examples of the Cu diffusion barrier metal film include Ta, TaN, Ti, TiN, W, WN, Ru, TiZrN, and an alloy film containing those. Next, the excess Cu material layer is removed by a chemical mechanical polishing (CMP) method, and Cu wiring integral with the planarized conductive via is formed. Thereafter, although it is not illustrated, the Cu diffusion barrier insulating film is formed. As the Cu barrier insulating film, for example, an insulating film of SiN, SiC, SiCN, SiON or the like can be used. By repeating this process, wiring 35a to 35c including three layers of metal are formed.

Next, a first insulating film having no Cu diffusion barrier property, a second insulating film having no Cu diffusion barrier property, and a Cu diffusion barrier insulating film are sequentially formed. The first insulating film and the second insulating film include a SiO2 film, a SiCOH film, or the like. Furthermore, as the Cu barrier insulating film, for example, an insulating film of SiN, SiC, SiCN, SiON or the like can be used as described above. The Cu diffusion barrier insulating film, the first insulating film, and the second insulating film correspond to the interlayer insulating film 33. Next, the Cu diffusion barrier insulating film on an outermost surface, the second insulating film and the first insulating film are patterned by via-first using lithography and etching techniques to selectively make a via hole to be an opening. Thereafter, the second insulating film portion is patterned to selectively form the opening. The opening is formed at a position covering an opening of the second electrode pad 72 on the second semiconductor chip portion 28 side. The opening is preferably formed in a size so that the opening covers the opening of the second electrode pad 72 and partially overlaps with the first electrode pad 71 to prevent light leakage due to misalignment in a case where the first semiconductor substrate and the second semiconductor substrate are bonded later. In other words, patterning is performed so as to have an opening and a via hole corresponding to the first electrode pad 71 to be formed.

Next, in the similar manner as described above, the first electrode pad 71, the first via 52 connected to the first electrode pad 71, and the first wiring 36 are formed so as to embed the Cu material in the opening and the via hole by using the dual damascene method. The first electrode pad 71 includes the metal of a fifth layer. With this configuration, the multilayer wiring layer is formed by the metal wiring 35a to 35c, the first wiring 36, the first electrode pad 71, the interlayer insulating film 33, and the insulating film.

Furthermore, an insulating thin film, which is extremely thin and uniform, can be formed on the first electrode pad 71.

Next, the first semiconductor substrate and the second semiconductor substrate are bonded so that the first electrode pads 71 and the second electrode pads 72 are arranged to have their multilayer wiring layers facing each other to directly contact and electrically connected. In other words, the first and second semiconductor substrates are physically bonded and electrically connected. At this time, the first electrode pad 71 and the second electrode pad 72 are also directly joined at the overlapping portion. In other words, the first electrode pad 71 and the second electrode pad 72 are thermally diffusion-bonded to each other by heat treatment. The heat treatment temperature here can be set about 100 degrees Celsius to 500 degrees Celsius. In addition, insulating films, which are interlayer insulating films, are surface-treated and plasma-bonded. Note that the insulating films, which are interlayer insulating films, can also be bonded to each other with an adhesive.

Here, the first electrode pad 71 and the second electrode pad 72 are bonded as being shifted from each other so that the total longitudinal length (L1+L2) of the first electrode pads 71 and the second electrode pads 72 becomes twice or more of the extending-direction length (L) of the first wiring 36 having a longer pitch (L1+L2≥2L).

In this manner, the first conductor of the first electrode pad 71 and the second conductor of the second electrode pad 72 are electrically connected near the bonding surface 40 since the insulating film is placed between their bonding surfaces 40 in advance and then heated to bond by causing crystal growth of copper, which is the conductors. Therefore, the first conductor and the second conductor are respectively disposed closer to the bonding surface 40 side than the logic circuit 55 and the wiring 58 formed in the first semiconductor chip portion 26 and the second semiconductor chip portion 28.

Next, the second semiconductor substrate is thinned by grinding and polishing from the back side by CMP or the like so that a necessary film thickness of the photodiode PD remains.

Next, a light shielding film including the photodiode PD corresponding to the optical black region is formed on the thinned surface via the insulating film. Furthermore, the color filter 44 and the on-semiconductor chip lens 45 are formed on the photodiode PD corresponding to the effective pixel array via the planarization film.

Subsequently, the bonded first semiconductor substrate and the second semiconductor substrate are separated into semiconductor chips to obtain individual semiconductor chips, and a target solid-state imaging device 31 illustrated in FIG. 3 can be obtained.

For the first electrode pad 71 and the second electrode pad 72, and the metal to be the wiring of the same layer with those, a material having high conductivity, high light-shielding property and easy bondability is desirable. As a material having such properties, a single material such as Al, W, Ti, Ta, Mo, or Ru or an alloy can be used, in addition to Cu.

It is preferable that film thicknesses of the first electrode pad 71 and the second electrode pad 72 according to the present embodiment are determined according to a wavelength of light on the side of the first semiconductor chip portion 26 that emits light. According to the present embodiment, since it is necessary to shield the light emitted from the hot carriers of the MOS transistors of the first semiconductor chip portion 26, the thickness of the electrode pads needs to be designed with respect to light having a wavelength of about 1 μm. For example, the film thickness of the first electrode pad 71 and the second electrode pad 72 can be about 50 nm to 800 nm.

According to the manufacturing method of the solid-state imaging device 31 according to the present embodiment, since the first electrode pad 71 and the second electrode pad 72 include metal as a wiring layer, the thickness of the entire bonded semiconductor chip can be reduced and the solid-state imaging device 31 can be made thinner, compared to the conventional technique. With this configuration, the solid-state imaging device 31 with less dark current and less random noise can be provided without increasing the thickness of the entire semiconductor chip.

Furthermore, according to the manufacturing method of the solid-state imaging device 31 according to the present embodiment, since the wiring, the connection wiring, and the electrode pad can be formed at the same time, it is possible to reduce the number of manufacturing steps, material cost, and a solid-state imaging device with little dark current and random noise can be manufactured at low cost.

<4. Solid-State Imaging Device According Second Embodiment>

A second embodiment of the solid-state imaging device according to the present technology will be described with reference to FIGS. 8 to 11. The present embodiment is different from the first embodiment illustrated in FIG. 6 in that a first electrode pad 81 and the second electrode pad 72 are bonded in a manner that their longitudinal directions are orthogonal to each other.

According to the present embodiment, a longitudinal length of the second electrode pad 72 is assumed to be L1, and a longitudinal length of a part of the first electrode pad 81, which is not overlapped with the second electrode pad 72, is assumed to be L2. Furthermore, an extending direction length of the first wiring 36 having a longer pitch of the first wiring 36 and the second wiring 58 is assumed to be L. Also, according to the present embodiment, the first electrode pad 81, the second electrode pad 72, and the first wiring 36 are arranged so that the total longitudinal length (L1+L2) of the first electrode pad 81 and the second electrode pad 72 which are shifted and bonded becomes twice or more of the extending direction length (L) of the first wiring 36 (L1+L2≥2L).

With the above configuration, the solid-state imaging device 31 according to the present embodiment can also achieve the similar effects as those of the solid-state imaging device 31 according to the first embodiment. Furthermore, since flexibility of the layout design in the two-dimensional direction increases and it is possible to bend at a desired place, there is an advantage that a routing amount of the wiring can be reduced.

Figure 11:
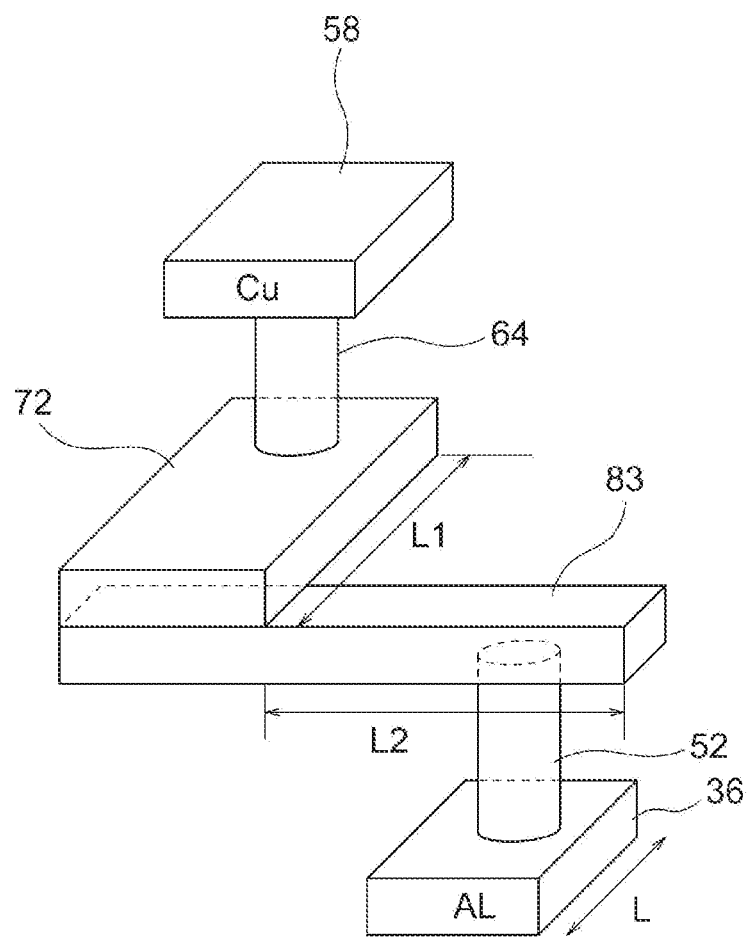
FIG. 11 is an enlarged configuration diagram illustrating a main part of a bonded area according to a modification of the second embodiment.

FIG. 11 is an enlarged configuration diagram illustrating a bonded area of the first semiconductor chip portion 26 and the second semiconductor chip portion 28 in a modified example of the present embodiment. The modification of FIG. 11 is different from the embodiment of FIG. 10 in that a width of a first electrode pad 83 is narrower than a width of the first electrode pad 81.

As illustrated in FIG. 11, even if the shapes of the first electrode pad 83 and the second electrode pad 72 are different, the similar effects as those of the above-described embodiment can be achieved by arranging the first electrode pad 83, the second electrode pad 72, and the first wiring 36 so that the total longitudinal length (L1+L2) of the shifted first electrode pad 83 and the second electrode pad 72 is twice or more of the extending-direction length (L) of the first wiring 36 having the longer pitch (L1+L2≥2L).

<5. Solid-State Imaging Device According to Third Embodiment>

Figure 12:
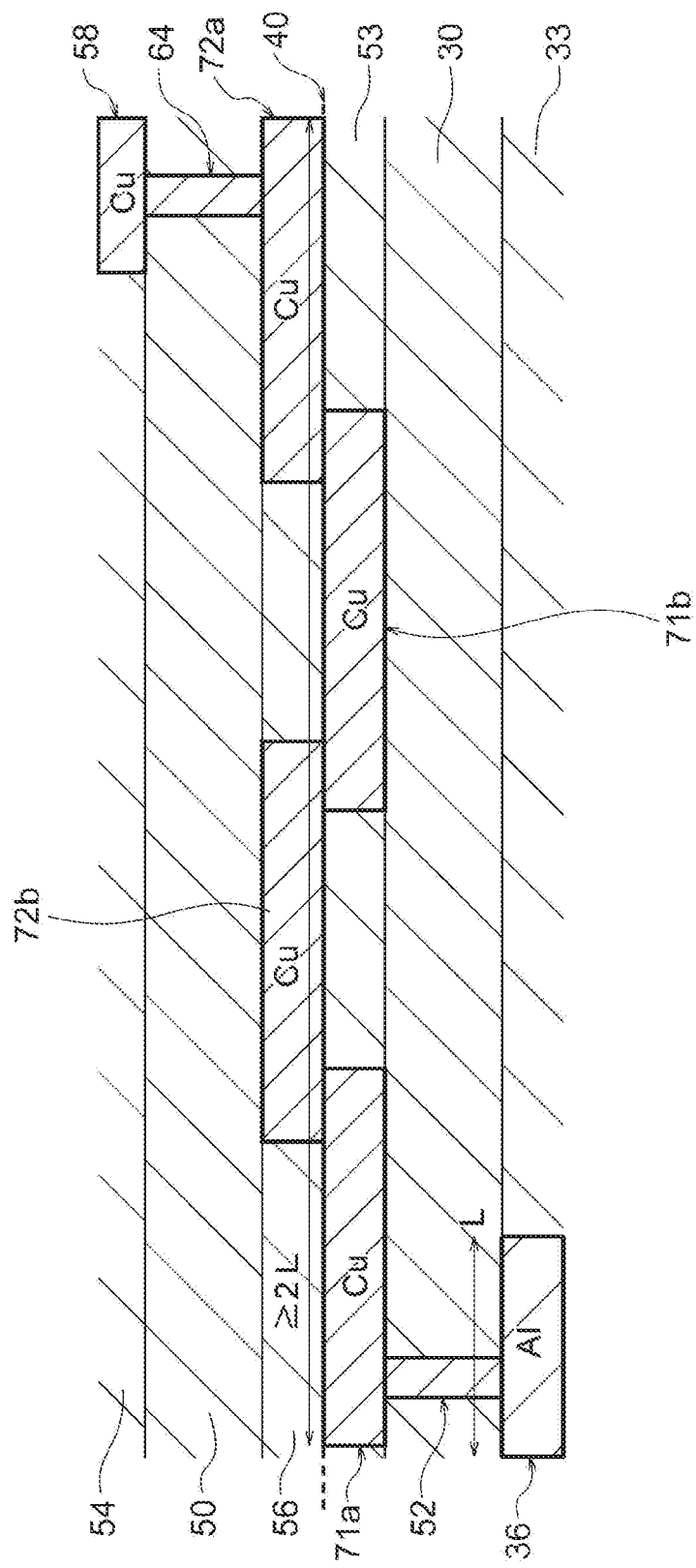
FIG. 12 is an enlarged cross-sectional diagram illustrating the main part of the bonded area according to a third embodiment.
Figure 13:
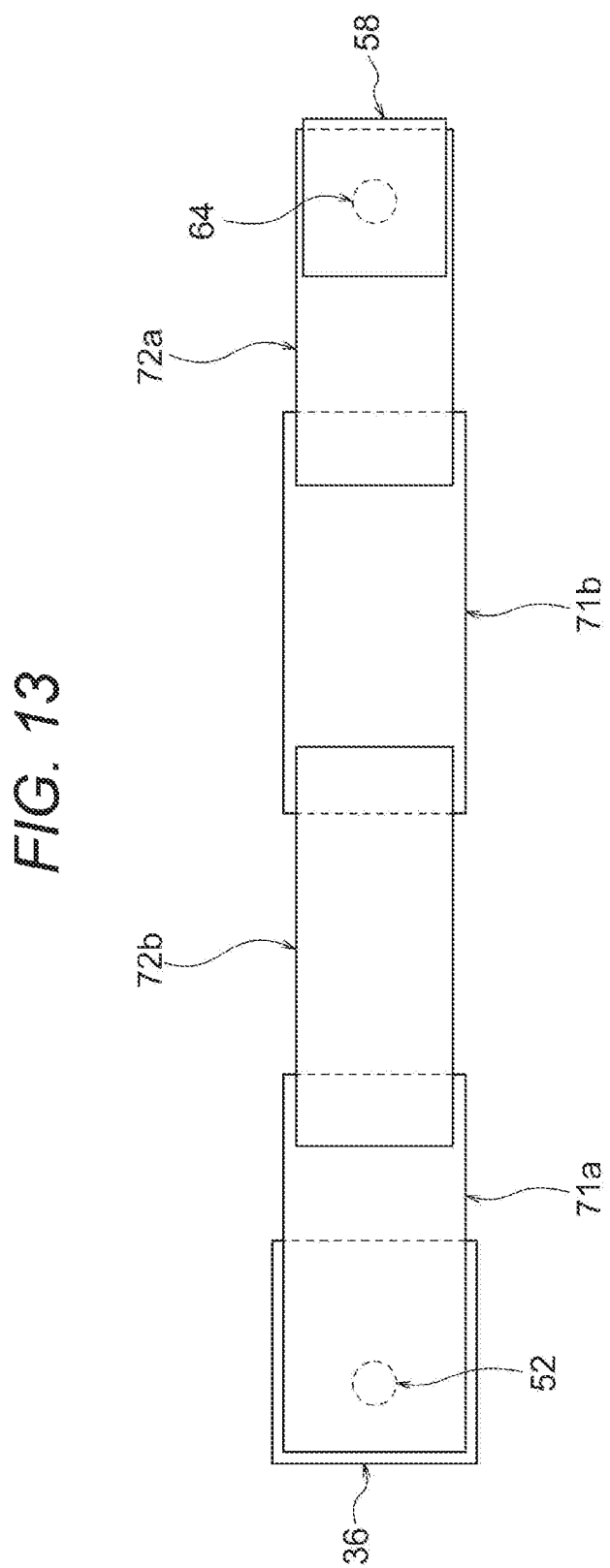
FIG. 13 is an enlarged plan diagram illustrating the main part of the bonded area according to the third embodiment.

A third embodiment of the solid-state imaging device according to the present technology will be described with reference to FIGS. 12 and 13. The present embodiment is different from the first embodiment illustrated in FIG. 6 in that the first via 52 and the second via 64 are connected through the plurality of first electrode pads 71a and 71b and second electrode pads 72a and 72b. Here, the number of first electrode pads and the number of second electrode pads are not limited to the present embodiment, and one of the pads may be a single pad or three or more.

According to the present embodiment, the respective longitudinal lengths of the second electrode pads 72a and 72b are assumed to be L1, and the longitudinal lengths of portions of the first electrode pads 71a and 71b, which are not overlapped with the second electrode pads 72a and 72b, are assumed to be L2. Furthermore, an extending direction length of the first wiring 36 having a longer pitch of the first wiring 36 and the second wiring 58 is assumed to be L. Also according to the present embodiment, the first electrode pad 81, the second electrode pad 72, and the first wiring 36 are arranged so that the total longitudinal length (L1×2+L2×2) of the first electrode pads 71a, 71b and the second electrode pads 72a, 72b which are bonded becomes twice or more of the extending-direction length (L) of the first wiring 36 (L1×2+L2×2≥2L).

With the above configuration, the solid-state imaging device 31 according to the present embodiment can also achieve the similar effects as those of the solid-state imaging device 31 according to the first embodiment. Furthermore, since the length of each Cu electrode pad can be shortened, the lifetime of EM and SM can be improved. In addition, since the CuCu bonding surface increases, the bonding strength increases. Furthermore, since it is possible to bend at a right angle at a desired place, there is an advantage that the flexibility of layout design is increased.

<6. Solid-State Imaging Device According to Fourth Embodiment>

Figure 14:
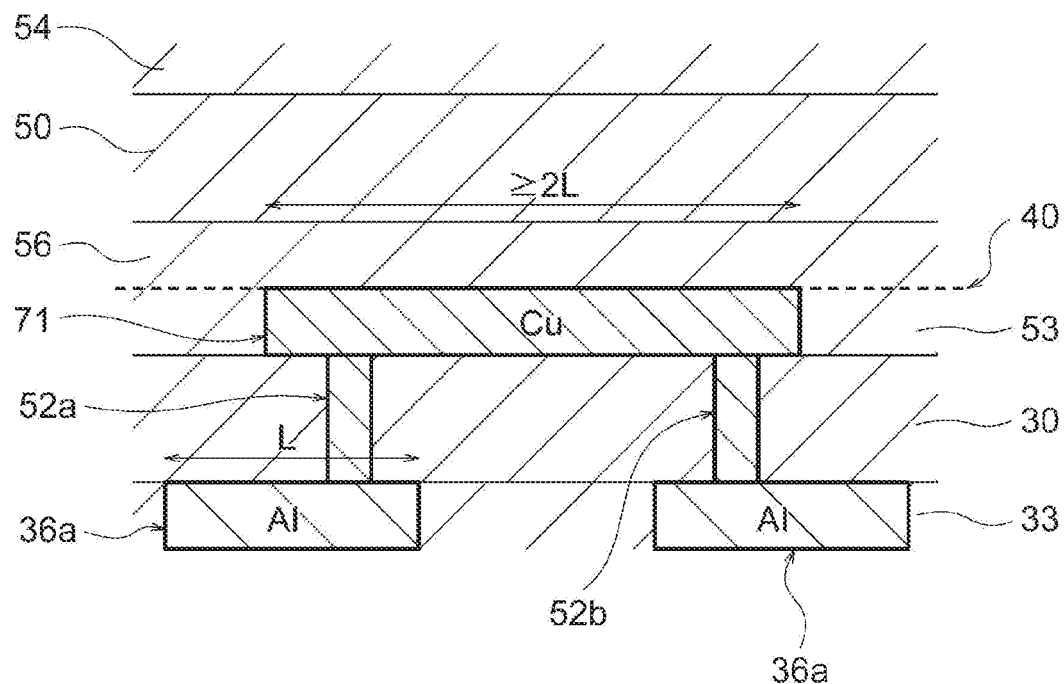
FIG. 14 is an enlarged cross-sectional diagram illustrating a main part of a bonded area according to a fourth embodiment.
Figure 15:
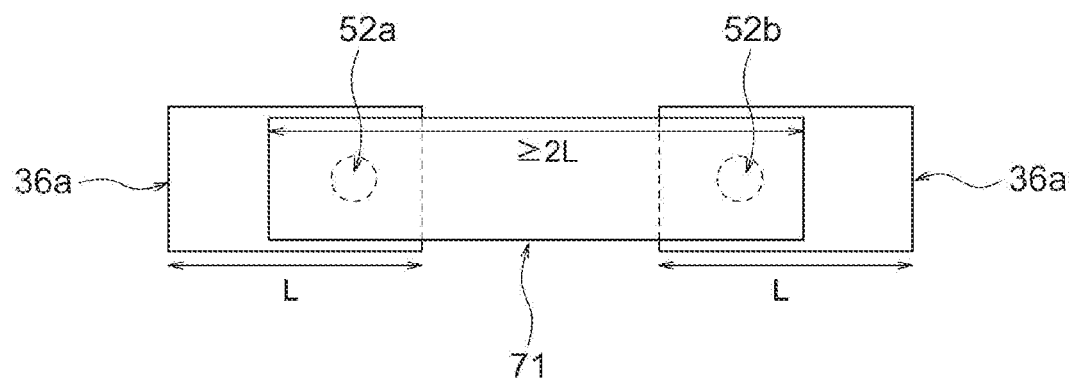
FIG. 15 is an enlarged plan diagram illustrating the main part of the bonded area according to the fourth embodiment.

A fourth embodiment of the solid-state imaging device according to the present technology will be described with reference to FIGS. 14 and 15. The present embodiment is different from the first embodiment illustrated in FIG. 6 in that electrode pads exist only in the first semiconductor chip portion 26, and two pieces of the first wiring 36a are connected to the electrode pads (the first electrode pad 71) through the first vias 52a and 52b.

According to the present embodiment, the longitudinal length of the first electrode pad 71 is assumed to be L2, and the extending-direction length of the first wiring 36 is assumed to be L. According to this embodiment, the first electrode pad 71 and two pieces of first wiring 36 are arranged so that the longitudinal length (L2) of the first electrode pad 71 becomes twice or more of the extending-direction length (L) of the first wiring 36 (L2≥2L). Here, the numbers of pieces of first wiring 36 and first vias 52 are not limited to two.

With the above configuration, the solid-state imaging device 31 according to the present embodiment can also achieve the similar effects as those of the solid-state imaging device 31 according to the first embodiment. In addition, since the Cu electrode pad is provided only on the semiconductor chip portion on one side, this can achieve an advantage that a short circuit between the Cu electrode pads due to misalignment can be prevented. Furthermore, the cost of the Cu electrode pad can be reduced.

<7. Solid-State Imaging Device According to Fifth Embodiment>

Figure 16:
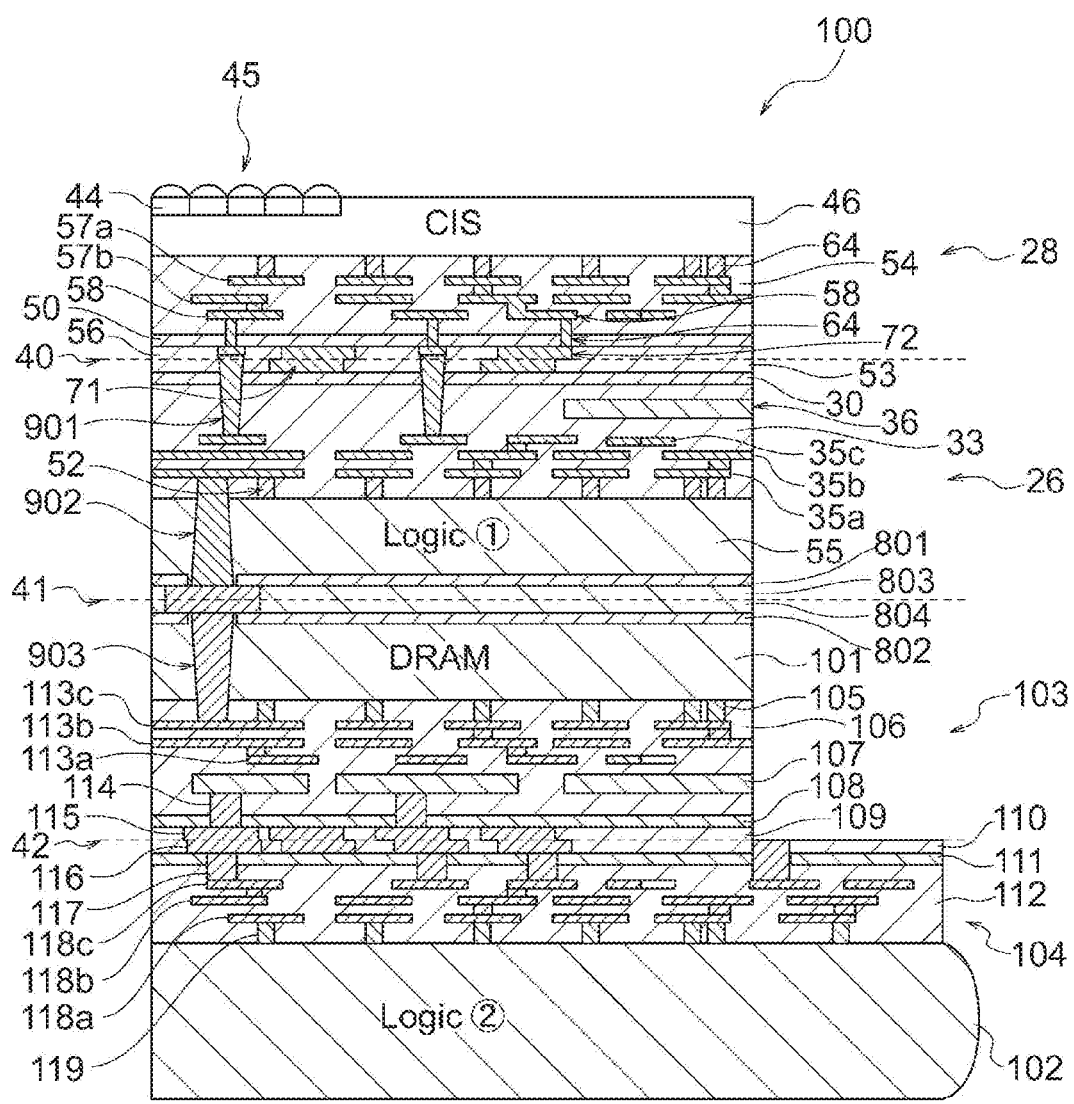
FIG. 16 is a schematic cross-sectional diagram illustrating a main part according to a fifth embodiment of the solid-state imaging device according to the present technology.

A solid-state imaging device according to a fifth embodiment of the present technology will be described with reference to FIG. 16. FIG. 16 is a schematic cross-sectional diagram illustrating a main part of a solid-state imaging device 100 having a multilayer laminated structure in which a CIS 46, a logic circuit 55, a DRAM 101, and a logic circuit 102 are bonded.

The solid-state imaging device 100 according to the present embodiment includes a laminated semiconductor chip in which a second semiconductor chip portion 28 on which a CIS 46 is formed, a first semiconductor chip portion 26 on which a logic circuit 55 is formed, a third semiconductor chip portion 103 on which a DRAM 101 is formed, and a fourth semiconductor chip portion 104 on which a logic circuit 102 is formed are laminated in order. The first semiconductor chip portion 26 and the second semiconductor chip portion 28 and the third semiconductor chip portion 103 and the fourth semiconductor chip portion 104 are bonded to each other so that the respective multilayer wiring layers face each other and their electrode pads are directly bonded to each other. The first semiconductor chip portion 26 and the third semiconductor chip portion 103 are bonded to each other so that their pieces of wiring are directly bonded to each other.

Regarding the first semiconductor chip portion 26 and the second semiconductor chip portion 28 of the present embodiment, in addition to the bonding illustrated in FIG. 3, the wiring 58 of the second semiconductor chip portion 28 and the wiring 901 of the first semiconductor chip portion 26 are connected to each other through a via 64 of the second semiconductor chip portion 28. Regarding the first semiconductor chip portion 26 and the third semiconductor chip portion 103 of the present embodiment, the wiring 902 of the first semiconductor chip portion 26 and the wiring 903 of the third semiconductor chip portion 103 are connected at the bonding surface 41. Furthermore, regarding the first semiconductor chip portion 26 and the third semiconductor chip portion 103 of the present embodiment, the interlayer insulating film 803 under the insulating layer 801 located under the logic circuit 55 of the first semiconductor chip portion 26 and the interlayer insulating film 804 above the insulating layer 802 located above the upper layer of the DRAM 101 of the third semiconductor chip portion 103 are connected at the bonding surface 41.

In the third semiconductor chip portion 103, the DRAM 101 is formed on the third semiconductor substrate including thinned silicon. In the lower layer of the third semiconductor substrate illustrated in FIG. 16, a multilayered wiring layer, in which a plurality of pieces of wiring 113a to 113c, that is, three layers of metal in this embodiment, and an aluminum (Al) wiring (upper layer wiring) 107 are arranged, is formed via the interlayer insulating film 106. As the wiring 113a to 113c, copper (Cu) wiring by a dual damascene method is used.

In the multilayer wiring layer of the third semiconductor chip portion 103, the third semiconductor substrate and the wiring 113c are connected, and pieces of wiring 113a, 113b and 113c of adjacent upper and lower layers are connected, through the conductive via 105. Furthermore, a third electrode pad (third conductor) 115 of metal is formed under the insulating layer 108 so as to face the bonding surface 42 to be bonded with the fourth semiconductor chip portion 104. The third electrode pad 115 is connected to the necessary wiring (upper layer wiring) 107 including aluminum (Al) of the fourth layer through the via 114. The third electrode pad 115 is used for wiring.

In the fourth semiconductor chip portion 104, a logic circuit 102 constituting a peripheral circuit is formed on a fourth semiconductor substrate including silicon. The logic circuit 102 includes a plurality of MOS transistors including CMOS transistors. In the upper layer of the fourth semiconductor substrate, illustrated in FIG. 16, on which the logic circuit 102 is formed, a multilayer wiring layer in which wiring 118a to 118c including a plurality of layers, that is three layers of metal in this embodiment, is disposed via the interlayer insulating film 112. As the wiring 118a to 118c, a copper (Cu) wiring by a dual damascene method is used.

In the multilayer wiring layer of the fourth semiconductor chip portion 104, the MOS transistor and the wiring 118c are connected, and pieces of wiring 118a to 118c of adjacent upper and lower layers are connected, through the conductive via 119. Furthermore, a fourth metal pad (fourth conductor) 116 is formed above the insulating layer 111 so as to face the bonding surface 42 with the third semiconductor chip portion 103. The fourth electrode pad 116 is connected to a necessary wiring (lower layer wiring) 118c including the first layer metal through the conductive via 117. The fourth electrode pad 116 is used for wiring.

The third semiconductor chip portion 103 and the fourth semiconductor chip portion 104 are electrically connected by directly bonding the third electrode pad 115 and the fourth electrode pad 116 facing the bonding surface 42 so that their multilayer wiring layers face each other. Near the bonding area of the third semiconductor chip portion 103, an interlayer insulating film 109 is formed. Near the bonding area of the fourth semiconductor chip portion 104, an interlayer insulating film 110 is formed. The interlayer insulating films 109 and 110 are bonded to the interlayer insulating films 106 and 112 via the insulating layers 108 and 111, respectively.

In the present embodiment, similarly to the first embodiment, the third electrode pad 115 and the fourth electrode pad 116 illustrated in FIG. 16 are bonded with their bonding surfaces as being shifted from each other. With this configuration, the solid-state imaging device 100 according to the present embodiment also achieves flexible layout designing.

Also according to the present embodiment, the electrode pads and the wiring 36 are arranged so that the total longitudinal length of the electrode pads to be shifted and bonded becomes twice or more of the extending-direction length of the wiring having a longer pitch. With this configuration, the solid-state imaging device 100 according to the present embodiment also achieves similar effects as those of the solid-state imaging device 31 of the first embodiment. Furthermore, in the solid-state imaging device 100, since the distance between the semiconductor chips is shortened by laminating a plurality of semiconductor chips directly above and below, the processing speed increases. Furthermore, in the solid-state imaging device 100, since the semiconductor chips having various functions are layered, the functions of the processing can be enhanced. Note that the laminated structure of the solid-state imaging device 100 is not limited to four layers, and the number of layers may be any number. In addition, the solid-state imaging device according to the present embodiment can be applied to any semiconductor device by including the above arrangement.

<8. Electronic Device According to Sixth Embodiment>

A sixth embodiment of the solid-state imaging device according to the present technology will be described with reference to FIG. 17.

Figure 17:
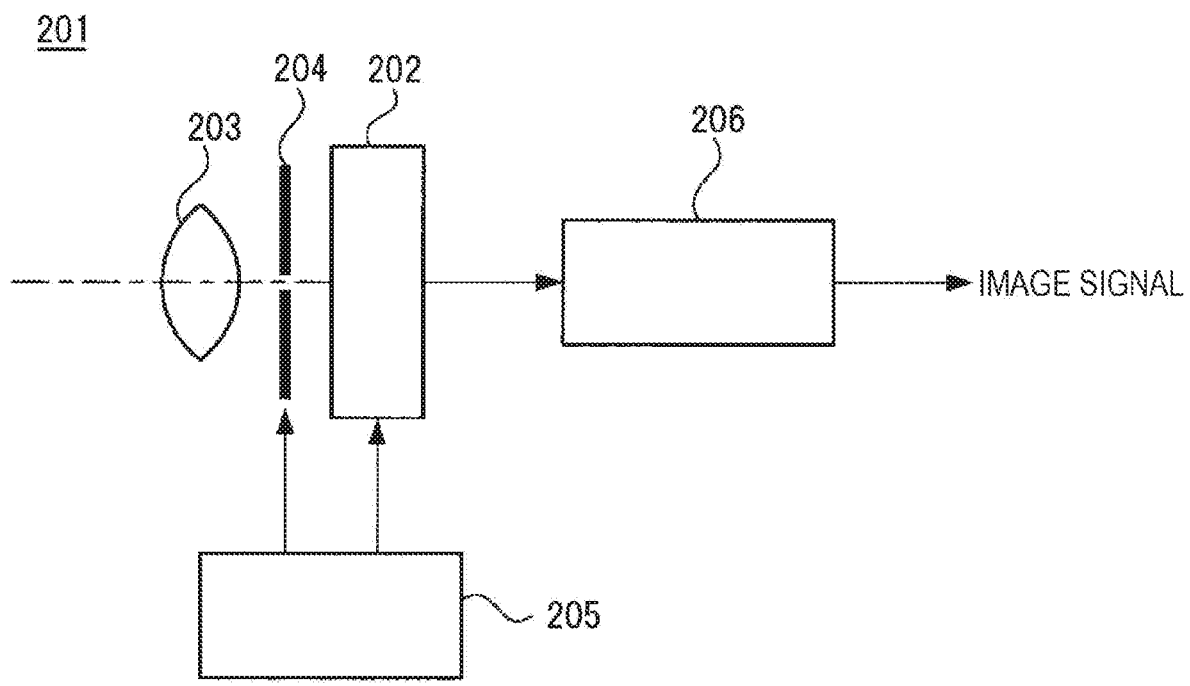
FIG. 17 is a schematic configuration diagram of an electronic device according to a sixth embodiment of the present technology.

FIG. 17 is a diagram illustrating an electronic device according to the present technology. The above-described solid-state imaging device according to the present technology can be applied to, for example, an electronic device such as a camera system like a digital camera, a video camera, and the like, a mobile phone having an imaging function, or another device having an imaging function.

FIG. 17 illustrates the sixth embodiment applied to a camera as an example of the electronic device according to the present technology. The camera according to the present embodiment is an example of a video camera capable of capturing a still image or a moving image. The camera 201 according to the present embodiment includes a solid-state imaging device 202, an optical system 203 for guiding incident light to the light receiving sensor unit of the solid-state imaging device 202, and a shutter device 204. Furthermore, a drive circuit 205 that drives the solid-state imaging device 202 and a signal processing circuit 206 that processes output signals of the solid-state imaging device 202 are included.

The solid-state imaging device 202 is applied to any of the above-described solid-state imaging devices. The optical system (optical lens) 203 forms an image with image light (incident light) from a subject on the imaging surface of the solid-state imaging device 202. As a result, the signal charge is accumulated in the solid-state imaging device 202 for a certain period of time. The optical system 203 may be an optical lens system including a plurality of optical lenses. The shutter device 204 controls a light irradiation period and a light shielding period in the solid-state imaging device 202. The drive circuit 205 supplies a drive signal for controlling the transfer operation of the solid-state imaging device 202 and the shutter operation of the shutter device 204. The signal of the solid-state imaging device 202 is transferred by a driving signal (timing signal) supplied from the drive circuit 205. The signal processing circuit 206 performs various types of signal processing. The video signal subjected to the signal processing is stored in a storage medium such as a memory or output to the monitor.

According to the electronic device according to the sixth embodiment, since the backside illumination type solid-state imaging device 202 in the above-described present technology is provided, light emitted by hot carriers from the MOS transistors of the logic circuit is not entered in the pixel array side, and dark current and random noise can be suppressed. Therefore, a high-quality electronic device can be provided. For example, a camera or the like with improved image quality can be provided.

Note that the embodiments according to the present technology are not limited to the above described embodiments and various changes can be made within the scope of the present technology. For example, a configuration in which all or a part of the above-described plurality of embodiments can be combined.

Furthermore, the present technology may be configured in following configurations.

(1) A solid-state imaging device including:
a first semiconductor chip including a first electrode pad, first wiring connected to the first electrode pad through a first via, and a logic circuit, which are formed in the first semiconductor chip; and
a second semiconductor chip connected to the first semiconductor chip and including a second electrode pad, second wiring connected to the second electrode pad through a second via, and a pixel array, which are formed in the second semiconductor chip,
in which
the first electrode pad and the second electrode pad are bonded as being shifted from each other on a bonding surface of the first semiconductor chip and the second semiconductor chip, and
a total length of the sifted and bonded first and second electrode pads in extending-direction of the wiring having a longer pitch of the first and second wiring is twice or more of an extending-direction length of the wiring having the longer pitch.

(2) The solid-state imaging device according to (1), in which an area of a bonding part of the first and second electrode pads is equal to or larger than a total area of bonding surfaces of first and second vias respectively connected to the first and second electrode pad.

(3) The solid-state imaging device according to (2), in which a size of the first electrode pad and a size of the second electrode pad are different.

(4) The solid-state imaging device according to (2), in which shapes of surfaces where the first and second electrode pads are bonded to each other are both rectangular shapes, and the first electrode pad and the second electrode pad are bonded in a manner that longitudinal directions of those are orthogonal to each other.

(5) The solid-state imaging device according to (4), in which a total length of a longitudinal length first electrode pad and a longitudinal length of a part of the second electrode pad, which is not bonded to the first electrode pad, is twice or more of an extending-direction length of the wiring having the longer pitch.

(6) The solid-state imaging device according to (1), in which the first via and the second via are connected through a plurality of the first and/or second electrode pads.

(7) A solid-state imaging device, including:
a first semiconductor chip including a first electrode pad, first wiring connected to the first electrode pad through a first via, and a logic circuit, which are formed in the first semiconductor chip,
in which a length of the first electrode pad in an extending-direction of the first wiring is twice or more of an extending-direction length of the first wiring.

(8) A method of manufacturing a solid-state imaging device, the method including:
forming a first electrode pad, first wiring connected to the first electrode pad through a first via, and a logic circuit in a first semiconductor chip;
forming a second electrode pad, second wiring connected to the second electrode pad through a second via, and a pixel array in a second semiconductor chip, which is bonded to the first semiconductor chip; and
bonding the first semiconductor chip and the second semiconductor chip on a bonding surface,
in which
the first electrode pad and the second electrode pad are bonded as being shifted from each other on the bonding surface, and
a total length of the shifted and bonded first and second electrode pads in an extending-direction of the wiring having a longer pitch of the first and second wiring is twice or more of an extending-direction length of the wiring having the longer pitch.

(9) An electronic device including a solid-state imaging device, the solid-state imaging device including:
a first semiconductor chip including a first electrode pad, a first wiring connected to the first electrode pad through a first via, and a logic circuit, which are formed in the first semiconductor chip; and
a second semiconductor chip bonded to the first semiconductor chip and including a second electrode pad, second wiring connected to the second electrode pad through a second via, and a pixel array in the second semiconductor chip,
in which the first electrode pad and the second electrode pad are bonded, as being shifted from each other, on a bonding surface of the first semiconductor chip and the second semiconductor chip, and a total length of the shifted and bonded first and second electrode pads in an extending-direction of the wiring having a longer pitch of the first and second wiring is twice or more of an extending-direction length of the wiring having the longer pitch.

REFERENCE SIGNS LIST 1, 1a to 1c, 31, 100 Solid-state imaging device
2 Pixel
3, 23 Pixel array (Pixel region)
4 Vertical drive circuit
4 Column signal processing circuit
6 Horizontal drive circuit
7 Output circuit
8, 24, 24-1, 24-2 Control circuit
9 Vertical signal line
10 Horizontal signal line
12 Input/output terminal
21 First semiconductor substrate
22 Second semiconductor substrate
25, 55, 102 Logic circuit
26 First semiconductor chip portion
28 Second semiconductor chip portion
30, 50, 108, 111, 801, 802 Insulating layer
32 Laminated semiconductor chip
35a to 35c, 36, 36a, 57a to 57b, 58, 107, 113a to 113c, 118a to 118c, 901 to 903 Wiring
40, 41, 42 Bonding surface
44 Color filter
45 On-semiconductor chip lens
46 CMOS image sensor (CIS)
52, 52a, 52b, 64, 105, 114, 117, 119 Via
33, 53, 54, 56, 106, 109, 110, 112, 803, 804 Interlayer insulating film
71, 71a, 71b, 73, 81, 83 First electrode pad (First conductor)
72, 72a, 72b Second electrode pad (Second conductor)
101 DRAM
103 Third semiconductor chip portion
104 Fourth semiconductor chip portion
115 Third electrode pad (Third conductor)
116 Fourth electrode pad (Fourth conductor)

The invention claimed is:

1. A solid-state imaging device comprising:
a first semiconductor chip including a first electrode pad, first wiring connected to the first electrode pad through a first via, and a logic circuit, which are formed in the first semiconductor chip; and
a second semiconductor chip connected to the first semiconductor chip and including a second electrode pad, second wiring connected to the second electrode pad through a second via, and a pixel array, which are formed in the second semiconductor chip,
wherein
the first electrode pad and the second electrode pad are bonded as being shifted from each other on a bonding surface of the first semiconductor chip and the second semiconductor chip, and
a total length of the shifted and bonded first electrode pad and the shifted and bonded second electrode pad in an extending-direction of a wiring having a longer pitch of the first wiring and the second wiring is twice or more of an extending-direction length of the wiring having the longer pitch.

2. The solid-state imaging device according to claim 1, wherein an area of a bonding part of the first electrode pad and the second electrode pad is equal to or larger than a total area of bonding surfaces of the first via and the second via respectively connected to the first electrode pad and the second electrode pad.

3. The solid-state imaging device according to claim 2, wherein a size of the first electrode pad and a size of the second electrode pad are different.

4. A method of manufacturing a solid-state imaging device, the method comprising:
forming a first electrode pad, first wiring connected to the first electrode pad through a first via, and a logic circuit in a first semiconductor chip;
forming a second electrode pad, second wiring connected to the second electrode pad through a second via, and a pixel array in a second semiconductor chip, which is bonded to the first semiconductor chip; and
bonding the first semiconductor chip and the second semiconductor chip on a bonding surface,
wherein
the first electrode pad and the second electrode pad are bonded as being shifted from each other on the bonding surface, and
a total length of the shifted and bonded first electrode pad and the shifted and bonded second electrode pad in an extending-direction of a wiring having a longer pitch of the first wiring and the second wiring is twice or more of an extending-direction length of the wiring having the longer pitch.

5. An electronic device comprising a solid-state imaging device, the solid-state imaging device including:
a first semiconductor chip including a first electrode pad, first wiring connected to the first electrode pad through a first via, and a logic circuit, which are formed in the first semiconductor chip; and
a second semiconductor chip bonded to the first semiconductor chip and including a second electrode pad, second wiring connected to the second electrode pad through a second via, and a pixel array, which are formed in the second semiconductor chip,
wherein
the first electrode pad and the second electrode pad are bonded as being shifted from each other on a bonding surface of the first semiconductor chip and the second semiconductor chip, and
a total length of the shifted and bonded first electrode pad and the shifted and bonded second electrode pad in an extending-direction of a wiring having a longer pitch of the first wiring and the second wiring is twice or more of an extending-direction length of the wiring having the longer pitch.

* * * * *